United States Patent [19]

Ito

[11] Patent Number: 5,926,030

[45] Date of Patent: Jul. 20, 1999

[54] METHOD OF REDUCING A MEASURING TIME DURING AN AUTOMATIC MEASUREMENT OF INTEGRATED CIRCUITS

[75] Inventor: Kiyoshi Ito, Tokyo, Japan

[73] Assignee: Ando Electric Co., Ltd., Tokyo, Japan

[21] Appl. No.: 08/816,835

[22] Filed: Mar. 13, 1997

[30] Foreign Application Priority Data

Mar. 28, 1996 [JP] Japan .................................... 8-099406

[51] Int. Cl.$^6$ .................................................... G01R 1/00
[52] U.S. Cl. ........................................ 324/765; 324/158.1
[58] Field of Search ............................... 324/158.1, 73.1, 324/765; 414/417, 422, 798; 438/14, 18; 251/40, 48; 209/571, 573

[56] References Cited

U.S. PATENT DOCUMENTS

| | | | |
|---|---|---|---|
| 3,662,881 | 5/1972 | Fineran | ..................................... 209/422 |
| 5,440,241 | 8/1995 | King et al. | ............................ 324/158.1 |

Primary Examiner—Vinh P. Nguyen
Attorney, Agent, or Firm—Flynn, Thiel, Boutell & Tanis, P.C.

[57] ABSTRACT

A method of testing ICs in parallel is capable of receiving a state signal from handlers to estimate process start times of the handlers, and of changing a test start request interruption wait time. Automatic carriages automatically supply and accommodate IC issue test start request interruption signals to an external device control circuit of an IC tester. IC testing stations execute tests of ICs at the same time. When the test start request interruption signals are not issued from all the automatic carriages, a computer of the IC tester reads an operating state of the automatic carriages which do not issue the test start request interruption signal so as to judge whether the automatic carriage is in a significant wait condition. The IC testing stations immediately execute the test of ICs if the automatic carriages are not in the significant state. The computer calculates an optimal wait time if the automatic carriage is in the significant state, and the IC testing stations execute the test at the time when the optimal wait time lapses.

9 Claims, 6 Drawing Sheets

METHOD OF REDUCING A MEASURING TIME DURING AN AUTOMATIC MEASUREMENT OF INTEGRATED CIRCUITS

BACKGROUND OF THE INVENTION

1. Field of the Invention

The present invention relates to a method of reducing a measuring time during an automatic measurement of integrated circuits (ICs) mounted on test stations which are arranged in parallel with one another.

2. Prior Art

An IC tester for testing ICs includes a plurality of IC testing or measuring parts (hereinafter referred to as test stations) on which the integrated circuits (ICs) are mounted. In case of testing a plurality of ICs at a time, modes for outputting the same test signals between respective stations at the same time (parallel mode between stations) are set for testing the ICs mounted on each test station. Further, automatic carriage means for automatically supplying ICs to be tested (hereinafter referred to as handlers) are connected to respective test stations so as to automatically supply the ICs to and accommodate the ICs in respective test stations.

A state of connection between the IC tester, test stations and handlers is illustrated in FIG. 3. In the same figure, denoted by 1 is an IC tester, 2A to 2D are test stations, and 3A to 3D are handlers. The IC tester 1 includes an external device control circuit 1A and a computer 1B.

Suppose that there are four test stations 2A to 2D and our handlers 3A to 3D are respectively connected to the IC tester 1. The IC tester 1 generally comprises a plurality of test stations and handlers respectively connected to the test stations. The number of the test station may be two, three or more than five. Each handler supplies a test start request interruption signal to the external device control circuit 1A of the IC tester 1 when the IC to be tested has completed the preparation for the test, namely, when the IC is ready for the test.

In FIG. 3, the test stations 2A to 2D are respectively connected to the handlers 3A to 3D, and the handlers 3A to 3D are respectively electrically connected to the external device control circuit 1A of the IC tester 1. The computer 1B processes signals issued from the handlers 3A to 3D to the external device control circuit 1A.

When the handlers 3A to 3D are used, a test start request relative to the IC tester 1 is carried out to start the test not by a switching operation by an operator who handles the IC tester but by a software process comprising the steps of issuing the test start request interruption signals from each handler to the IC tester 1, and receiving the test start request interruption signal by the external device control circuit 1A of the IC tester 1.

Since all the handlers connected to the IC tester 1 are not always operated in synchronization with one another, but issue the test start request interruption signals separately to the external device control circuit 1A of the IC tester 1, the test stations 2A to 2D do not complete the preparation for the test at the same time.

In order to reduce the test time by increasing the number of test stations for executing the test at the same time, the IC tester 1 waits a fixed time until the test start request interruption signals are issued from the plurality of handlers to the external device control circuit 1A.

The computer 1B reads the test start request interruption signals issued from each handler for verifying from which handler the test start request interruption signal is issued. Upon verification of the test start request interruption signal, the external device control circuit 1A waits for test start request interruption signals issued from remaining handlers which are respectively set or arranged in parallel with one another for testing.

Since a wait time is set or measured by the IC tester 1, if the test start request interruption signals issued from the remaining handlers are not received by the external device control circuit 1A within the set wait time, the test is executed by the test stations which are connected to the handlers from which the test start request interruption signals are issued. During the execution of test, the test start request interruption signal from the handler is held, and the test execution wait condition continues until the first executed test is completed.

The operation of the conventional method of testing ICs of FIG. 3 will now be described with reference to a flow chart of FIG. 2. FIG. 2 shows an operation of starting a test after the external device control circuit 1A of the IC tester 1 waits for a fixed time until it receives test start request interruption signals issued from the plurality of handlers 3A to 3D, particularly, FIG. 2 shows the operation when the test stations 2A to 2D are set or arranged in parallel with one another for testing.

In Step 11 of FIG. 2, the external device control circuit 1A receives a test start request interruption signal from any one of the handlers 3A to 3D. In Step 12, the computer 1B judges whether this test start request interruption signal is the first interrupt, and an interruption wait timer starts to count the wait time in Step 13 if the test start request interruption signal is the first interrupt.

Suppose, for example, that the test start request interruption signal is first issued from the handler 3A connected to the test station 2A, the external device control circuit 1A receives the test start request interruption signal and verifies from which handler the test start request interruption signal is issued, and the interruption wait timer starts to count the wait time.

The wait time is set in advance by a setting part, etc., not shown. In Step 15, it is judged whether the previously set wait time has lapsed or not, and if the wait time has not lapsed, a wait condition continues.

During the continuation of the wait condition, the external device control circuit 1A receives the test start request interruption signals from other handlers wherein the test start request interruption signals from other handlers are subject to the processes in Steps 11 and 12. If the test start request interruption signal is not the first interruption in Step 12, and hence it is subject to the process in Step 14.

In Step 14, it is judged whether there are interrupts from the handlers connected in parallel with the IC tester 1. If there are interrupts from all handlers, the test is executed in Step 16 regardless of the lapse of the wait time in Step 15.

If there is no interrupt from all the handlers, the program returns to a step before Step 11 where the external device control circuit 1A waits to receive the test start request interruption signals from other handlers until the lapse of the specified wait time in step 15. For example, if the test start request interruption signals are issued from the handlers 3B and 3C in a previously set wait time, the external device control circuit 1A verifies from which handlers the test start request interruption signals are issued and further waits the start of the test.

If the set wait time lapses in Step 15, only a test station connected to the handler from which the test start request interruption signal is issued to the external device control circuit 1A starts the test without waiting for the issuance of the test start request interruption signals from the remaining handlers. The test is executed in a state where the handlers 3A to 3C are arranged in parallel with one another.

If the test is executed in Step 16 owing to the lapse of the specified wait time in Step 17, the external device control circuit 1A only verifies the handler 3D but holds interrupt based on the test start request interruption signal from the handler 3D even if the handler 3D issues the test start request interruption signal to the external device control circuit 1A after executing the test.

If the test is completed by the test stations 2A to 2C in Step 18, the external device control circuit 1A receives the test start request interruption signals issued from the remaining handlers in Step 19, and the processes in Step 11 and succeeding steps are repeated, then a next wait time is counted by the wait timer. The handler, which completed the discharge of the tested ICs and the supply of the ICs to be tested next time upon completion of the test by the test stations 2A to 2C, issues again the test start request interruption signal to the external device control circuit 1A.

Likewise, if the external device control circuit 1A receives the test start request interruption signals from all the handlers, the test is executed at that time. Even if the external device control circuit 1A does not receive the test start request interruption signal from one or more handlers, the test is executed at the time when the wait time set by the wait timer lapses.

In case of testing ICs by the test stations which are arranged in parallel with one another in the structure of FIG. 3, if the test start request interruption signal is issued from the handler immediately after the start of the test in the processes of FIG. 2, the test station connected to the handler which issued the test start request interruption signal immediately after the start of test holds the test until the next test since the wait time set by the IC tester is held constant, causing a problem that the test time is wasted.

Further, in case that the handlers do not issue the test start request interruption signals because of trouble or the like, the external device control circuit 1A waits the issuance of the test start request interruption signals until the lapse of the specified time, which also causes a problem that the test time is wasted.

SUMMARY OF THE INVENTION

The present invention is to provide a method of testing ICs by receiving state signals from handlers, estimating process start time by the handlers connected to test stations which are arranged in parallel with one another for testing ICs, and changing the test start request interruption signals or wait time from the handlers.

To achieve the above object, the method of testing ICs comprises an IC tester 1 including an external device control circuit 1A and a computer 1B, a plurality of IC measuring parts 2A to 2D respectively executing a test for the ICs mounted thereon, automatic carriage means 3A to 3D respectively attached to the plurality of IC measuring parts 2A to 2D for automatically supplying and accommodating the ICs, the automatic carriage means or carriages 3A to 3D respectively issuing test start request interruption signals to the external device control circuit 1A of the IC tester 1, wherein said automatic carriage means 3A to 3D mount the ICs on the IC measuring parts 2A to 2D when they issue the test start request interruption signals up to a predetermined set arbitrary last wait time, and the IC measuring parts 2A to 2D execute the test at the same time, and wherein the external device control circuit 1A holds to receive the test start request interruption signals until the completion of execution of the test when the test start request interruption signals are issued from remaining automatic carriage means after the last wait time lapsed so that the measured ICs are accommodated in the automatic carriage means, and the external device control circuit 1A receives the test start request interruption signals from the automatic carriage means 3A to 3D so that the IC measuring parts 2A to 2D sequentially execute the test of ICs, said method comprising the IC measuring parts 2A to 2D executing the test of ICs when the external device control circuit 1A receives the test start request interruption signals from all the automatic carriage means, the computer 1B of the IC tester 1 reading an operating state of the automatic carriage means which does not issue the test start request interruption signal when the test start request interruption signals are not issued by all the automatic carriage means 3A to 3D so as to judge whether said automatic carriage means is in a significant wait condition, and the IC measuring parts 2A to 2D immediately executing the test of ICs if the automatic carriage means is not in the significant state, the computer 1B calculating an optimal wait time if the automatic carriage means is in the significant state, and the IC measuring parts 2A to 2D executing the test at the time when the optimal wait time lapsed.

BRIEF DESCRIPTION THE DRAWINGS

Figure 5:
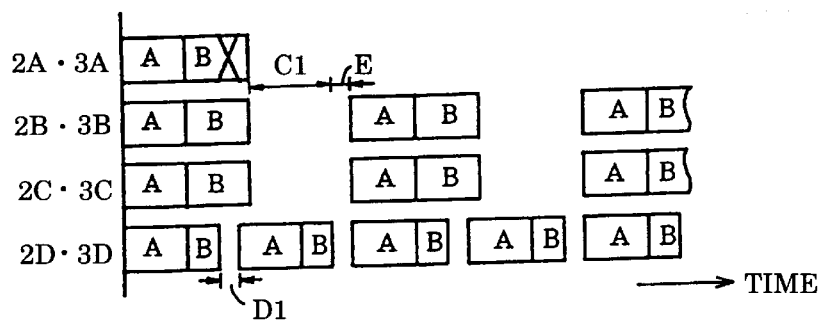
Figure 5:
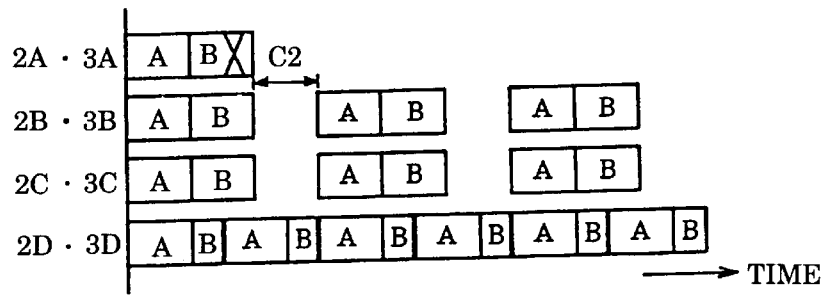
Figure 6:
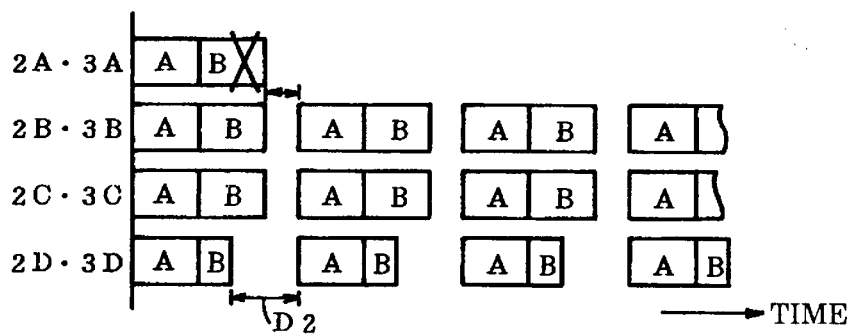
Figure 6:
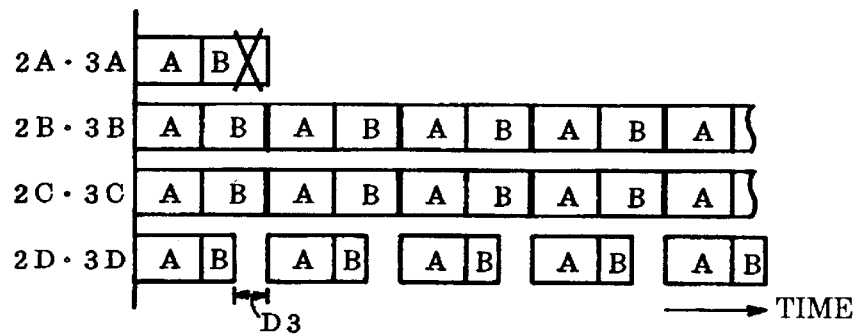

FIGS. 4(A), 5(A) and 6(A) respectively show the operation by the conventional method and FIGS. 4(B), 5(B) and 6(B) respectively show the operation by the method of the present invention.

PREFERRED EMBODIMENT OF THE INVENTION

A method of testing ICs according to a preferred embodiment of the invention will be now described with reference to FIG. 1.

Constituents which are the same as those for carrying out the conventional method of testing ICs are denoted by the same numerals and the explanations thereof are omitted.

Figure 1:
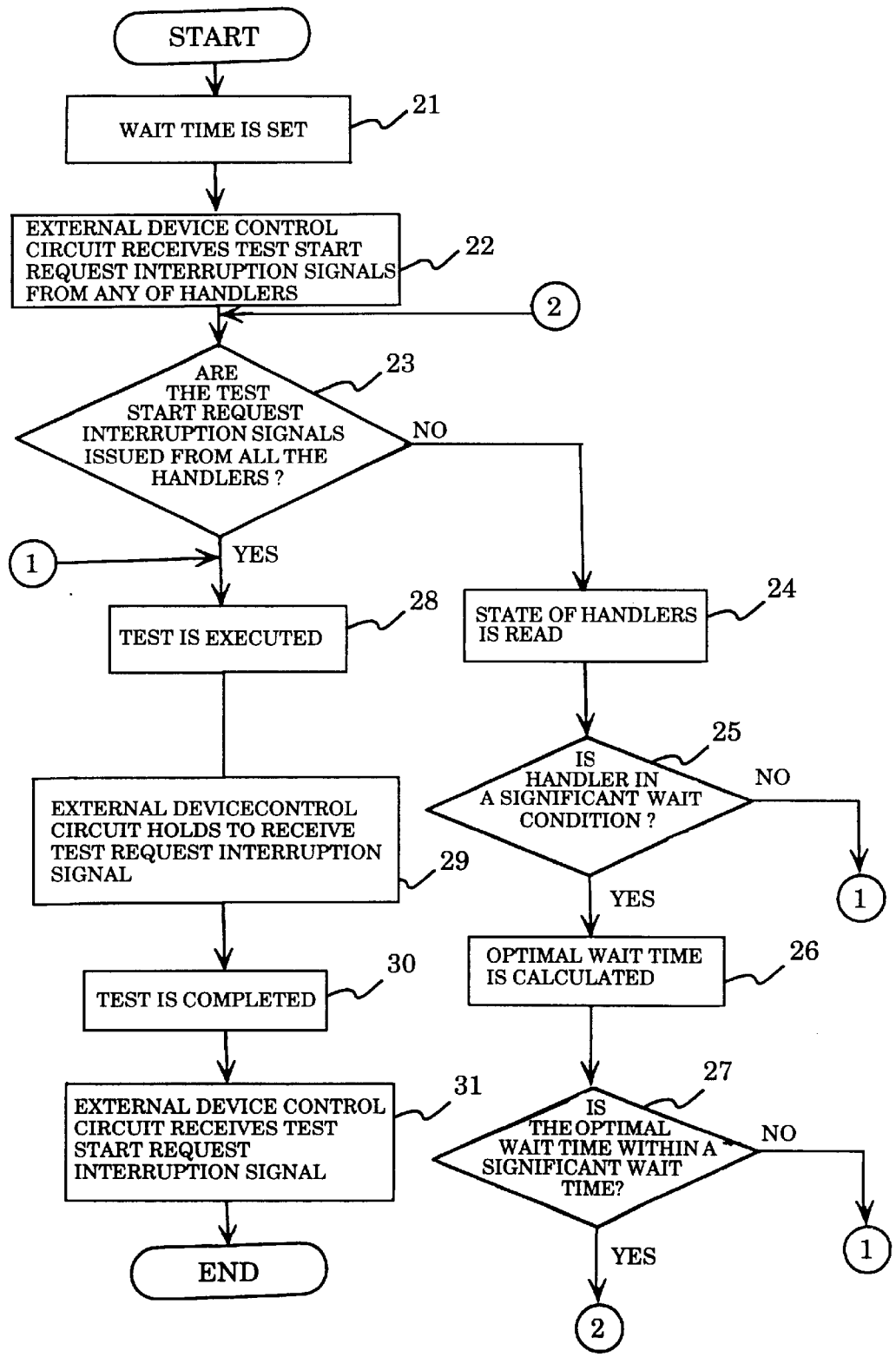
FIG. 1 is a flow chart showing an operation of parallel testing of ICs according to the method of the present invention.
Figure 2:
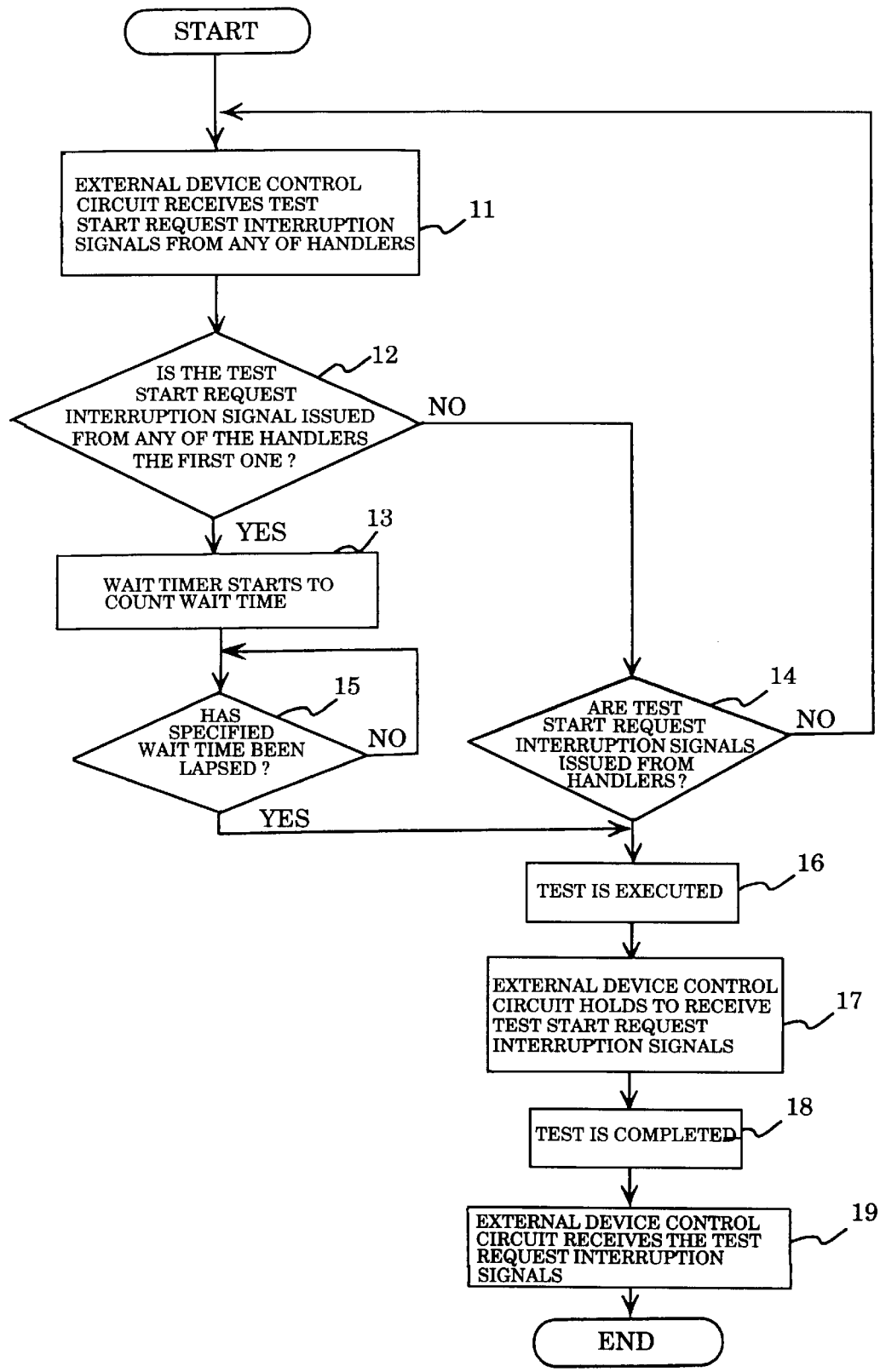
FIG. 2 is a flow chart showing an operation of parallel testing of ICs according to the conventional method.

FIG. 1 is a flow chart showing an operation of parallel testing by test stations according to the present invention, and explaining the case where the test stations 2A to 2D are set or arranged in parallel with one another for testing in the same manner as the operation of FIG. 2.

In Step 21 of FIG. 1, a wait time is set. This wait time is the same as that which is measured by the wait timer in Step 13 of FIG. 2, for example, It is set by inputting an average estimated measuring time by an operator based on a previously measured time corresponding to the IC measuring time obtained by measuring the IC by an IC tester when the first test is executed.

In Step 22, when the external device control circuit 1A receives an interrupt, the computer 1B reads from which handler the test start request interruption signal is issued. In Step 23, if the test start request interruption signals are issued from the handlers connected to all stations, the test is immediately executed in Step 28.

In Step 24, the computer 1B reads the state of handler which does not issue the test start request interruption signal, for example, the handler is now heating the testing part or it is stopped because of jam unless the test start request interruption signals are not issued from all the handlers which are arranged in parallel with one another for testing.

In Step 25, the external device control circuit 1A supplies the state of handler to the computer 1B, and the computer 1B judges whether the handler can issue the test start request interruption signal within the wait time set to the handler from the state of condition of the handler read by the external device control circuit 1A, namely, computer 1B judges whether it is in an effective wait time or not. If the computer 1B judges that the handler can issue the test start request interruption signal, the computer 1B judges it is in the effective wait condition in Step 26, and calculates the optimal wait time until the issuance of the test start request interruption signals from other arbitrary handlers. As a result, the test station connected to the handler which issued the first test start request interruption signal waits the execution of the test.

The optimal wait time until the issuance of the test start request interruption signals by the handlers can be primarily determined from the state of the handlers. For example, a table showing the state of handlers and the wait time is prepared in advance by the computer 1B, and the optimal wait time can be determined by the condition of the handler. The condition of the handler may be replaced with the time until the completion of preparation for issuing the test start request interruption signal by the handler.

If the wait time calculated in Step 26 is less than that set in Step 21, the external device control circuit 1A waits the issuance of the test start request interruption signal from the handler in Step 27.

That is, if the test start request interruption signals are estimated to be issued from the handlers connected to the test stations which are arranged in parallel with one another for testing within the wait time set in Step 21, the test is started after the start request interruption signal is issued by the handler connected to the last test station.

If the computer 1B judges that the handler can not issue the test start request interruption signal within the wait time set to the handler in Step 25, the test is started only by the test station connected to the handler which issued the test start request interruption signal in Step 28. If the optimal wait time is greater than the previously set wait time in Step 21, the test is executed only by the test station connected to the handler which issued the test start request interruption signal in Step 27.

Even if the external device control circuit 1A receives the test start request interruption signal during the execution of the test, it holds to receive the test start request interruption signal in Step 29, and thereafter it receives the test start request interruption signal in Step 31 upon completion of the test in Step 30 in the same manner as illustrated in FIG. 2.

Figure 3:
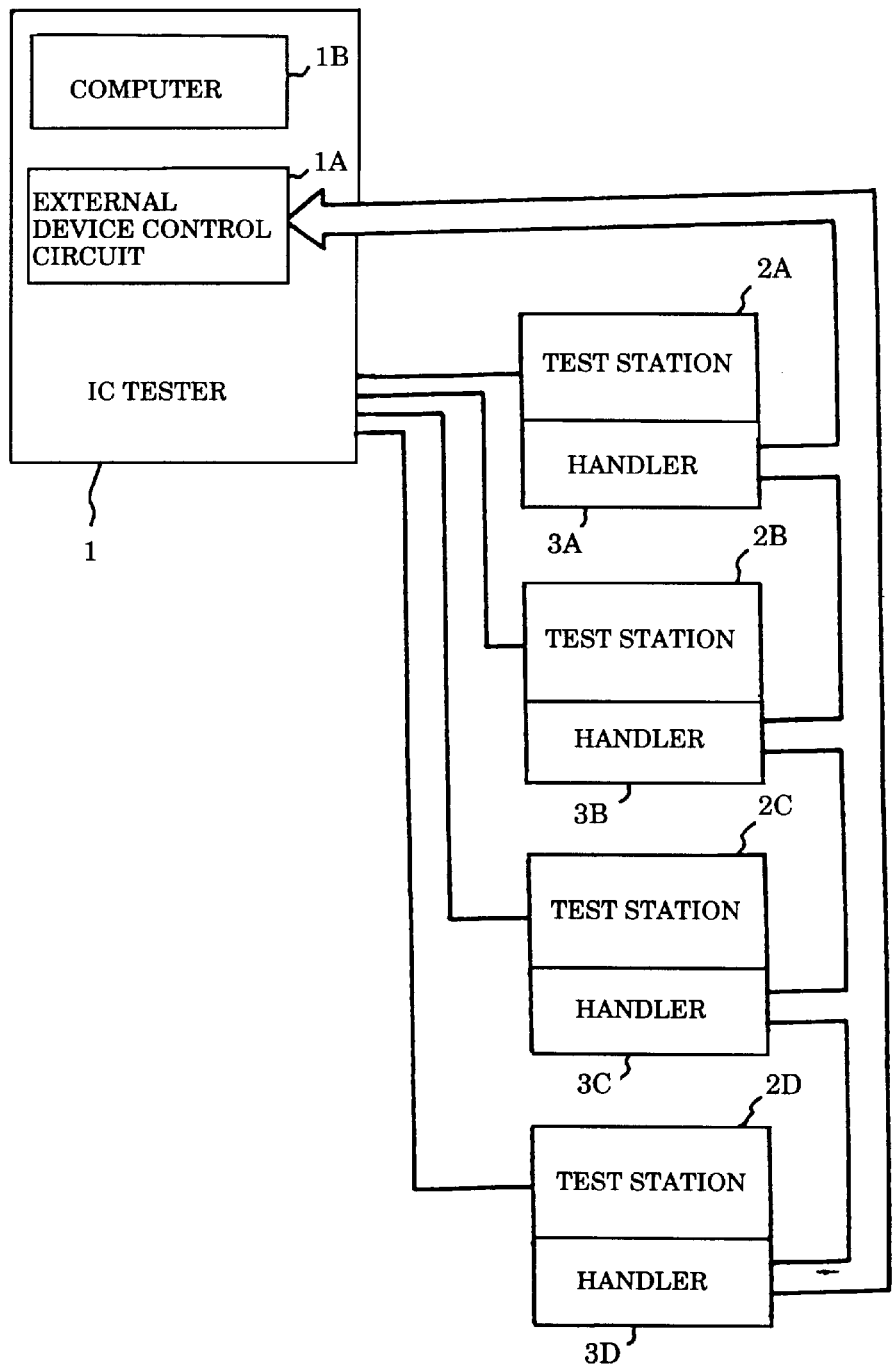
FIG. 3 is an example of a structure of an IC test system.

The operations in FIGS. 1 and 2 will be now described with reference to FIGS. 4(A) and 4(B) to FIGS. 6(A) and 6(B). In these figures, the principle of the operation by the conventional method and that of the operation by the method of the present invention, which have been respectively practically conceived, are compared with each other with reference to the flow of time in case that four test stations and four handlers are respectively connected to the IC tester 1 as shown in FIG. 3.

In FIGS. 4(A) and 4(B), the principles of operation by the conventional method and that of the present invention are compared with each other supposing that the process time by the handler 3D is quick when all the four test stations and handlers respectively normally operate and the previously set wait time is short. FIG. 4(A) shows the operation by the conventional method and FIG. 4(B) shows the operation by the method of the present invention. In FIGS. 4A and 4B, each horizontal axis shows a lapse of time, wherein denoted by "A" shows a test time by each test station and "B" shows a process time by each handler in which the process time by the handler 3D is short.

In FIG. 4(A), the test stations 2A to 2D connected to the handlers 3A to 3D are respectively operating. When the process by the handler 3D is completed, the handler 3D issues the test start request interruption signal to the external device control circuit 1A of FIG. 3. The counting of the previously set wait time is started by the wait timer. However, if the previously set wait time "D1" is short, the counting of the wait time is completed before the processes by the other handlers are completed, so that the test start request interruption signals are not issued by the other handlers, and hence a second test is executed only by the test station 2D connected to the handler 3D.

Upon lapse of the test time "A" and the a process time "B", the handler 3D issues again the test start request interruption signal. Since the test start request interruption signals issued from the other handlers 3A to 3C to the external device control circuit 1A during the execution of the test by the test station 2D connected to the handler 3D are held during a time "C1", the handler 3D issues the test start request interruption signal and at the same time a third test is executed supposing that the test start request interruption signals are issued from all the handlers.

Since the process time by the handler 3D is short, the test which is executed only by the test station 2D connected to the handler 3D and the test which is executed by the four test stations 2A to 2D connected to the handlers 3A to 3D are repeated from the fourth and succeeding tests.

In FIG. 4(B), the process time "B" of the handler 3D is short in the execution of the first test like the case of FIG. 4(A). At the time when the handler 3D completed the process, the wait time is set and at the same time the test start request interruption signal is issued from the handler 3D to the external device control circuit 1A.

At this time, the other handlers 3A to 3C are under processing. The computer 1B reads the state of handlers 3A to 3C and judges that the handlers 3A to 3C are now under processing and can not issue the test start request interruption signals in the set wait time "D1". Accordingly, the test station 2D connected to the handler 3D immediately start the second test without waiting the lapse of the wait time "D1".

Since the test start request interruption signals issued from the other handlers 3A to 3C to the external device control circuit 1A are held during a time "C2" while the test station 2D connected to the handler 3D executes the test, the handler 3D issues the test start request interruption signal and at the same time, the third test is executed supposing that the test start request interruption signals are issued from all the handlers. According to FIGS. 4A and 4B, the process time in FIG. 4(B) is quickened by the time corresponding to the wait time "D1".

Figure 4:
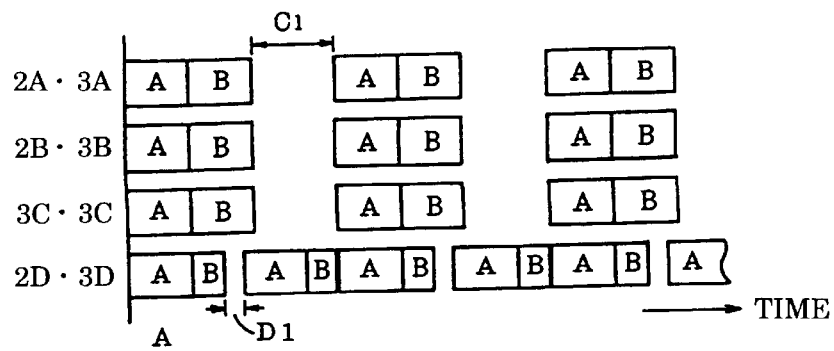
Figure 4:
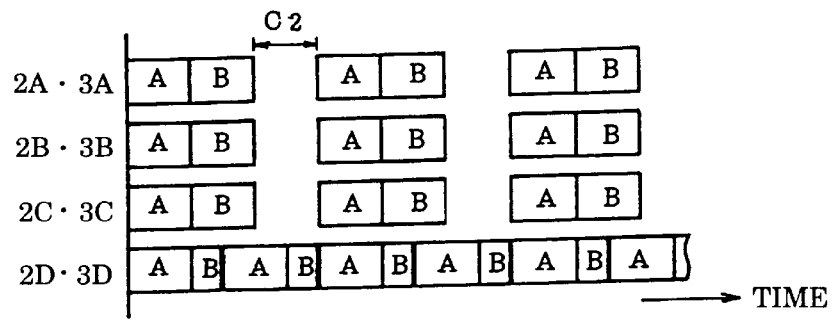

FIGS. 5(A) and 5(B) are views showing the comparison of the operation by the conventional method and that of the present invention supposing that the handler 3A does not normally operate during the execution of test from the state in FIG. 4. FIG. 5(A) shows the operation by the conventional method and FIG. 5(B) shows the operation by the method of the present invention.

When the process of the handler 3D is completed in FIG. 5(A), the handler 3D issues the test start request interruption signal to the external device control circuit 1A of FIG. 3. The wait timer starts counting of the previously set wait time.

Since the previously set wait time "D1" is short, the counting of the wait time is completed before the completion of processes by other handlers so that the second test is executed only by the test station 2D connected to the handler 3D since the test start request interruption signals are not issued from other handlers.

Upon lapse of the test time "A" and the process time "B", the handler 3D issues again the test start request interruption signal. Although the test start request interruption signals issued from other handlers 3B and 3C to the external device control circuit 1A are held during the time "C1" while the test is executed by the test station 2D connected to the handler 3D, the handler 3A does not issue the test start request interruption signal since it is stopped during the process by the handler 3D, so that the third test can not be executed at the same time when the handler 3D issues the test start request interruption signal, but it can be executed upon lapse of the wait time "D1" which is equal to "E1".

Since the process time by the handler 3D is short, the test only by the test station 2D connected to the handler 3D and the tests by the three test stations are respectively repeated at the fourth and succeeding tests upon lapse of the wait time "E".

In FIG. 5(B), the process time "B" of the handler 3D is short during the execution of the test like FIG. 5(A). Upon completion of the process by the handler 3D, a wait time is set and the test start request interruption signal is issued from the handler 3D to the external device control circuit 1A.

At this time, the handler 3A is stopped and the handlers 3B and 3C are under processing. The computer 1B reads the state of the handlers 3A to 3C, and further reads the state that the handler 3A is stopped and can not issue the test start request interruption signal, and judges that the handlers 3B and 3C are still under processing and will not issue the test start request interruption signals within the set wait time "D1". Accordingly, the test station 2D connected to the handler 3D starts the second test without waiting the lapse of set wait time "D1".

While the test station 2D connected to the handler 3D executes the test, the test start request interruption signals issued from the handlers 3B and 3C to the external device control circuit 1A are held during the time "C2", and the handler 3D issues the test start request interruption signal, and at the same time the third test is executed supposing that the test start request interruption signals are issued from all the handlers. At this time, since the computer 1B judges that the handler 3A is not in a significant wait condition, the process time is quickened as shown in FIG. 5(B) by the time without waiting, namely, saving the set wait time "D1" and the wait time "E".

FIGS. 6(A) and 6(B) are views showing the comparison of the operation by the conventional method and that of the present invention supposing that the previously set wait time is long and the handler 3D does not normally operate during the execution of test. FIG. 6(A) shows the operation by the conventional method and FIG. 6(B) shows the operation by the method of the present invention. In FIG. 6(A), upon completion of the process, the handler 3D issues a test start request interruption signal to the external device control circuit 1A of FIG. 3. Whereupon, the wait timer starts to count the wait time.

Since the previously set wait time "D2" is long, the handlers 3B and 3C issue the test start request interruption signals during the counting of the wait time. Since the test start request interruption signal is not issued from the handler 3A, the second test is executed except the test station 2A connected to the handler 3A at the time when the previously set wait time "D2" lapsed. Likewise, the same processes are repeated to execute the test.

The process time "B" of the handler 3D is short in FIG. 6(B) in the execution of the first test like the case of FIG. 6(A). At the time when the handler 3D completed the process, the wait time is set and at the same time the test start request interruption signal is issued from the handler 3D to the external device control circuit 1A. At this time, the handler 3A is stopped and other handlers 3B and 3C are under processing. The computer 1B reads the state of handlers 3A to 3C, and also reads the state that the handler 3A is stopped and it can not issue the test start request interruption signal, and then it judges that the handlers 3B and 3C are still under processing and they can not issue the test start request interruption signals within the set wait time "D2".

Accordingly, the test station 2D connected to the handler 3D starts the second test at the time when the test start request interruption signals are issued from the handlers 3B and 3C to the external device control circuit 1A, namely, at the time of lapse of a wait time "D3", without waiting the lapse of the wait time "D2", and the same processes are repeated to execute the test.

Since the computer 1B judges that the handler 3A is not in a significant wait condition, the process time shown in FIG. 6(B) is quickened by the time without waiting, namely, saving the set wait time "D2".

Since the test start wait time of the test stations which are set or arranged in parallel with one another for testing is changed depending on the state of handlers, the number of test stations to be set or arranged in parallel with one another per unit of time can be increased.

What is claimed is:

1. A method of testing ICs comprising an IC tester including an external device control circuit and a computer, a plurality of IC test stations respectively executing a test for the ICs mounted thereon, automatic carriage means respectively cooperating with the plurality of IC test stations for automatically supplying and accommodating the ICs, the automatic carriage means respectively issuing test start request interruption signals to the external device control circuit of the IC tester, wherein said automatic carriage means mount the ICs on the IC test stations when the automatic carriage means issue the test start request interruption signals up to a predetermined set arbitrary last wait time, and the IC test stations execute the test at the same time, and wherein the external device control circuit holds to receive the test start request interruption signals until the completion of execution of the test when the test start request interruption signals are issued from remaining automatic carriage means after the last wait time has lapsed so that the measured ICs are accommodated in the automatic carriage means, and the external device control circuit receives the test start request interruption signals from the automatic carriage means so that the IC test stations sequentially execute the test of the ICs, wherein:

the IC test stations execute the test of the ICs when the external device control circuit receives the test start request interruption signals from all the automatic carriage means;

the computer reads an operating state of the automatic carriage means which does not issue the test start request interruption signal when the test start request interruption signals are not issued from all the automatic carriage means so as to judge whether said automatic carriage means is in a significant wait condition;

the IC test stations immediately execute the test of the ICs if the automatic carriage means is not in the significant wait condition;

the computer calculates an optimal wait time if the automatic carriage means is in the significant wait condition; and the IC test stations execute the test at the time when the optimal wait time has lapsed.

2. The method of testing ICs according to claim 1, wherein the automatic carriage means are handlers.

3. The method according to claim 1, wherein the test stations comprise IC testing parts.

4. A method of testing integrated circuits comprising an integrated circuit tester including an external device control circuit and a computer, a plurality of integrated circuit test stations for respectively executing a test of the integrated circuits mounted thereon, individual handlers respectively cooperating with the plurality of integrated circuit test stations for automatically supplying and accommodating the integrated circuits, the handlers respectively issuing test start request interruption signals to the external device control circuit of the integrated circuit tester, and the handlers mounting the integrated circuits on the integrated circuit test stations when the respective handlers issue the test start request interruption signals, the method comprising:

a) reading which of the handlers sent the test start request interruption signal when the external device control circuit receives the test start request interruption signal;

b) determining if test start request interruption signals have been sent from all of the handlers, and if not:

c) reading a state of significant wait time condition of the individual handlers to detect which of the at least one of the handlers has not sent the test start request interruption signal;

d) judging that the at least one of the handlers which has not sent the test start request interruption signal within a wait time will issue the test start request interruption signal within the significant wait time condition;

e) calculating an optimal wait time when the computer judges that the handler will issue the test start request interruption signal within the wait time;

f) comparing the optimal wait time with a significant wait time condition; and g) executing immediate testing of the integrated circuits on the integrated circuit test stations having sent the test start request interruption signal when the optimal wait time is within the significant wait time condition.

5. The method according to claim 4, wherein the method returns to step (b) when the optimal wait time is greater than the significant wait time condition in step (f).

6. The method according to claim 4, wherein execution of immediate testing of the integrated circuits on the integrated circuit test stations occurs after determining that the test start request interruption signals have been sent from all of the handlers.

7. The method according to claim 4, wherein the step of executing immediate testing of the integrated circuits comprises the external device control circuit holding test start request interruption signals during execution of the test, and upon completion of the test, the external test device control circuit receiving the held test start request interruption signals.

8. The method according to claim 4, including immediately executing testing of the integrated circuits on the integrated circuit test stations that have sent the test start request interruption signal after judging that the at least one of the handlers which has not sent the test start request interruption signal within the wait time will not issue the test start request interruption signal within the significant wait time condition.

9. The method according to claim 4 including determining the wait time for operation of the test stations before any other steps begin.

* * * * *